United States Patent
Rowan, Sr. et al.

[11] Patent Number: 5,806,948
[45] Date of Patent: Sep. 15, 1998

[54] RETROFITTABLE BATTERY CABINET FOR TELECOMMUNICATIONS ENCLOSURES

[76] Inventors: W. Frank Rowan, Sr.; William F. Rowan, Jr., both of 1876 Taylor Pl., Ontario, Calif. 91761

[21] Appl. No.: 876,266

[22] Filed: Jun. 16, 1997

[51] Int. Cl.$^6$ .................................................. A47B 47/00
[52] U.S. Cl. ....................... 312/293.3; 312/257.1; 312/265.6; 312/223.1; 312/350; 429/99; 180/68.5
[58] Field of Search .................. 312/257.1, 293.3, 312/293.1, 296, 25, 100, 210, 222, 236, 265.6, 270.3, 350, 351.1, 334.27, 334.32, 334.33, 334.35, 334.44; 219/209, 218, 521, 385; 429/99; 180/68.5

[56] References Cited

U.S. PATENT DOCUMENTS

| | | | |
|---|---|---|---|
| 1,718,374 | 6/1929 | Oberst | 312/25 X |
| 3,184,276 | 5/1965 | Billups | 312/25 X |
| 3,304,032 | 2/1967 | Yates | 312/351.1 X |
| 3,868,158 | 2/1975 | Labove | 312/350 |
| 3,912,348 | 10/1975 | Seymour | 312/100 |
| 3,930,552 | 1/1976 | Kunkle et al. | |
| 3,983,952 | 10/1976 | McKee | 180/68.5 |
| 3,989,118 | 11/1976 | Hansen | 180/68.5 |
| 4,013,136 | 3/1977 | Fear | 180/68.5 |
| 4,049,404 | 9/1977 | Johnson | 96/108 |
| 4,139,249 | 2/1979 | Hillman | 312/334.44 X |
| 4,251,026 | 2/1981 | Siegel et al. | 236/49.3 |
| 4,258,816 | 3/1981 | Klink | 180/68.5 |
| 4,293,075 | 10/1981 | Veralrud | 312/350 X |
| 4,325,058 | 4/1982 | Wagner et al. | 340/562 |
| 4,480,710 | 11/1984 | Hansen | 180/68.5 |
| 4,661,734 | 4/1987 | Capuano et al. | 219/209 X |
| 4,848,859 | 7/1989 | Edmonds et al. | 312/257.1 |
| 4,883,725 | 11/1989 | Gerard | 429/99 |
| 4,957,829 | 9/1990 | Holl | 429/99 |
| 4,991,674 | 2/1991 | Fullenkamp | 180/68.5 |
| 4,994,940 | 2/1991 | Thouvenin et al. | 361/429 |
| 5,140,744 | 8/1992 | Miller | 429/99 |
| 5,156,226 | 10/1992 | Boyer et al. | 180/65.1 |
| 5,165,770 | 11/1992 | Hahn | 312/265.6 X |
| 5,187,423 | 2/1993 | Marton | |
| 5,198,638 | 3/1993 | Massacesi | 219/209 |
| 5,232,277 | 8/1993 | Cassady et al. | 312/296 |
| 5,236,792 | 8/1993 | Larkin et al. | 429/121 |
| 5,304,434 | 4/1994 | Stone | 429/99 |
| 5,340,340 | 8/1994 | Hastings et al. | 312/223.1 X |
| 5,366,827 | 11/1994 | Belanger et al. | 429/99 |
| 5,367,598 | 11/1994 | Devenish, III et al. | |
| 5,392,873 | 2/1995 | Masuyama et al. | 180/68.5 |
| 5,403,679 | 4/1995 | Stone | 429/99 |
| 5,437,939 | 8/1995 | Beckley | 429/99 |

*Primary Examiner*—Peter M. Cuomo
*Assistant Examiner*—James O. Hansen
*Attorney, Agent, or Firm*—Cislo & Thomas

[57] ABSTRACT

A retrofit battery cabinet for telecommunications equipment. A 48 volt DC or other battery power supply is held in a retrofit battery cabinet to provide a retrofittable battery power supply to telecommunications cabinets. Dual and separately operable battery trays provide a weight-bearing capacity of more than 500 pounds each. The battery trays extend through an open front end of a housing be sealed by a removable door. The weight load exerted by the retrofit battery cabinet is supported by the concrete or other pad providing ultimate support to the entire configured assembly, and not by the associated telecommunications equipment cabinet. Outriggers, mounting brackets, and nesting of the housing beneath the telecommunications cabinet serve to secure the retrofit battery cabinet in place, ensuring the electrical connection between the batteries and the telecommunications equipment without direct attachment of the retrofit battery cabinet to the telecommunications cabinet support columns. Exhaust fans shrouded by the outriggers ventilate hydrogen gas and provide a more controlled thermal environment for the batteries. The removable door may have a full-length front vent at its base or, alternatively, a duct may connect the retrofit battery cabinet to a subterranean or other thermal reservoir for constant-temperature air flow. A thermostat, timer or timers, alarm reset, battery connections, fuses, breakers, and the like may be held and made easily and readily available at a central console. An intrusion alarm may alert a central monitoring station or control of removal of the front door panel.

15 Claims, 5 Drawing Sheets

RETROFITTABLE BATTERY CABINET FOR TELECOMMUNICATIONS ENCLOSURES

BACKGROUND OF THE INVENTION

1. Field of the Invention

This invention relates to power supply housings for telecommunications cabinets and more particularly to a retrofit battery cabinet that can be added to a telecommunications cabinet after the construction and installation of the telecommunications equipment.

2. Description of the Related Art

Telecommunications equipment is often centralized in certain installations so that a relatively large number of customers or accounts in an area can be serviced in a central and relatively small geographical area. Currently, telecommunications equipment cabinets are situated in centralized compounds, much like electric power substations, or on right of ways, small plots adjacent to roads, streets, and thoroughfares. Generally, these telecommunications equipment cabinets stand alone or in series with each equipment cabinet servicing a specific area or series of accounts that are grouped together for convenience or along the lines of other criteria.

One common type of telecommunications equipment cabinet known in the art has been designated a Type 80 telecommunications equipment cabinet. Generally, the Type 80 provides easy and convenient access and availability at the ground level for telecommunications equipment. The Type 80 cabinet generally supports the electronic circuitry comprising the telecommunications equipment off the ground by approximately one to two feet. Raising the telecommunications equipment off the ground allows it to be protected from the elements by the cabinet and serves to protect the vulnerable circuitry from ground water while at the same time making it more easily available to service technicians who otherwise would have to work very inconveniently close to the ground for the lowermost circuit modules held in the cabinet. The Type 80 is often supported on a cement or concrete pad and is meant to withstand significant shock and weather duress such as is provided by earthquakes, tornadoes, and heavy storms.

As with other telecommunications equipment cabinets, the Type 80 requires power in order to energize the electronic and switching circuitry held within it. Generally, such circuitry operates off of direct current (DC). Rectifiers or the like can convert alternating current readily available from local power grids to supply the telecommunications equipment.

Generally, such power supplies are very reliable. However, there are occasionally times when the power supply from the local power grid fails. Storms, earthquakes, and icy conditions can all operate to disrupt the power supply by the grid. Under such circumstances, telecommunications equipment such as that enclosed and protected by a Type 80 telecommunications equipment cabinet would be left without power and those relying upon the operation of the enclosed telecommunications equipment (such as local telephone users or the like) are left without means by which they can communicate via telephone or otherwise. During times of emergency, this can be a most dangerous situation as the convenience and ready availability of telecommunications operates to invite heavy reliance upon such telecommunications. Additionally, emergency conditions often make the ability to communicate to local emergency services of extreme importance so that medical emergencies, fires, and the like can be handled by local authorities.

Additionally, with the cessation of local telecommunications ability, the access to long distance telecommunication networks is likewise disabled. Individual customers relying upon the network access, locally and long distance, are then isolated and left to their own resources without the ability to communicate to others who previously had been readily available through the telecommunications network.

In order to temporarily accommodate emergency conditions or other circumstances where the local power grid fails the telecommunications equipment cabinet, local battery power supplies are provided that continue to supply the telecommunications equipment the required power during the interim when the local power grid is unavailable. Due to the quick response by local power generating and supplying authorities, the reliance upon battery power may be only a few minutes to a few hours. However, there may be times when extended periods of power must be supplied to the telecommunications equipment cabinet by the batteries for longer periods of grid power loss. Battery power supplies can bridge the time during which the local grid power supply is unavailable and temporary power generators have not yet been brought to the telecommunications equipment cabinet to supply it with power.

By providing a reliable battery power supply, emergency and blackout conditions are accommodated without severe interruptions in the availability of the telecommunications network serviced by the telecommunications equipment cabinet. By providing battery power to the telecommunications equipment cabinet, increased telecommunications network reliability is provided. However, it becomes an important element of maintenance to ensure that the battery power supplies are well-maintained and kept in good condition. To this end, sophisticated battery power supplies have been developed that provide reliable battery power to Type 80 and other telecommunications equipment cabinets.

In the past, Type 80 and other telecommunications equipment cabinets have only been provided with battery power by small, minimal-power batteries which only provided power necessary for constant minimal power to electronic equipment. As these cabinets are now part of the telecommunications network infrastructure, it is important to accommodate the currently existing infrastructure while providing reliable and preferably long-term battery power supplies to telecommunications cabinets. As the Type 80 telecommunications equipment cabinet provides a space below its telecommunications equipment holding portion, retrofit battery cabinets have been developed to make use of this space in order to provide a reliable battery power supply to the telecommunications equipment cabinet. However, in the past, such battery cabinets have not provided the best means by which such batteries may be maintained, accessed, serviced, and/or kept from vandalism and mischief.

As shown in the patent to Massacesi (U.S. Pat. No. 5,198,638 issued Mar. 30, 1993), a retractable battery tray is disclosed providing some measure of support and accessibility for the special batteries used to power telecommunications equipment. However, cabinets such as those disclosed in the Massacesi patent generally relied upon the telecommunications equipment cabinet itself for ultimate support. As the batteries used to supply power to telecommunications equipment often weigh on the order of 100–200 pounds each and as anywhere from 4 to 8 batteries are often used to supply the standard voltage used to power telecommunications equipment, the burden of such weight upon the telecommunications cabinet is significant and could lead to mechanical instability or even catastrophic failure.

Additionally, such batteries operate best when subject to a comfortable room temperature. If the batteries get too cold, the power output is diminished, but the batteries are not injured. If the batteries get too hot, power is also diminished, but the batteries may also suffer chemical or mechanical damage. Ventilation controls in prior battery trays did not optimize the air flow over the batteries in order to cool them and in order to vent hydrogen gas which is often generated by the batteries during their useful life. Additionally, single tray constructions are known in the art which may better be served by double tray constructions. Moreover, while such single battery trays may slide relative to connecting supports to the telecommunications equipment cabinet, the use of slide rails or the like may impose undue and unnecessary stress upon the connecting frame mediating the sliding battery tray with the telecommunications cabinet.

Due to these shortcomings in the prior art, a battery tray which addresses these problems while offering additional advantages and features would advance the art and provide better means by which batteries used as power supplies for telecommunications equipment can be accessed, maintained, and stored.

SUMMARY OF THE INVENTION

The present invention resides in a retrofittable battery cabinet for telecommunications enclosures and cabinets that provides enhanced features and operations, making accessing, storage, maintenance, and preservation of such batteries easier while extending the useful life of such batteries by affording them better protection from the elements and an overall more accommodating environment.

Additionally, the retrofittable battery cabinet of the present invention relies upon the ultimate support for the associated telecommunications equipment cabinet to bear its weight, rather than the telecommunications equipment cabinet itself. In so doing, mechanical stress otherwise applied to the telecommunications equipment cabinet that might cause mechanical instability or the like is shifted to the ground pad below the telecommunications equipment cabinet. In so supporting itself upon the ground pad, the retrofittable battery cabinet of the present invention relies upon leveling feet that are only accessible from inside the battery cabinet itself. This prevents intentional or negligent mis-adjustment of the stable situation or disposition achieved by the battery cabinet once it has been appropriately leveled and adjusted by a service technician or the like.

Additional protective measures are also provided to the enclosed batteries by the retrofittable battery cabinet of the present invention. These measures include propitiously situated internal fans that draw air over the batteries and through the battery cabinet from a strategically situated vent in the front door of the battery cabinet. Additionally, a thermostatic control activating the fans, battery breakers, and fan and battery fuses are also provided by the battery cabinet of the present invention.

Additionally, the temperature internal to the retrofittable battery cabinet of the present invention may be maintained by propitious use of a subterranean air reservoir that may be used to maintain confines of the battery cabinet at a constant temperature. As is well known, caves and other subterranean structures generally maintain a constant temperature throughout the year. In colder climates, this temperature may be warmer than the average wintertime temperature, and in summer may be cooler than the corresponding average summertime temperature. By relying upon this readily-available source of heating and cooling, heating pads or the like are not necessary in order to warm the batteries and likewise, cooling equipment is not required. An additional means by which the battery cabinet environment may be controlled is by the use of flaps or the like on vents which allow only controlled ingress of air external to the battery cabinet confines.

Special weight-bearing rollers or the like can be used to support the slidable battery platform, or tray, from below. This relieves the stress of the weight applied upon the battery cabinet housing that would be imposed by slide rails along the sides of the platform.

An intrusion alarm may be provided. A removable door provides a generally tight seal in conjunction with a gasket surrounding the open front end of the battery cabinet. Outriggers attachable to the sides of the battery cabinet may provide connection or association with support pillars for the associated telecommunications equipment cabinet. Attachment of such outriggers or other portions of the retrofittable battery cabinet of the present invention can thereby provide stability without deriving support from the telecommunications equipment cabinet.

OBJECTS OF THE INVENTION

It is an object of the present invention to provide better maintenance, access, protection, and support for batteries used to supply power to telecommunications equipment in telecommunications equipment cabinets.

It is an object of the present invention to provide a retrofittable battery cabinet that provides such better operating conditions for telecommunications equipment batteries.

It is an object of the present invention to provide a retrofittable battery cabinet that supports itself without bearing any load upon the associated telecommunications equipment cabinet.

It is an additional object of the present invention to provide a retrofittable battery cabinet for telecommunications equipment cabinets that has its level adjustably controlled only from within the confines of the battery cabinet to prevent mischief or inadvertent displacement of the battery cabinet through its leveling feet.

It is yet another object of the present invention to provide a well-ventilated, temperature-controlled environment for telecommunications equipment batteries.

It is yet an additional object of the present invention to provide a temperature-controlled environment for telecommunications equipment batteries that rely upon subterranean, thermally-constant sources of temperature control.

These and other objects and advantages of the present invention will be apparent from a review of the following specification and accompanying drawings.

DESCRIPTION OF THE PREFERRED EMBODIMENT(S)

Figure 1:
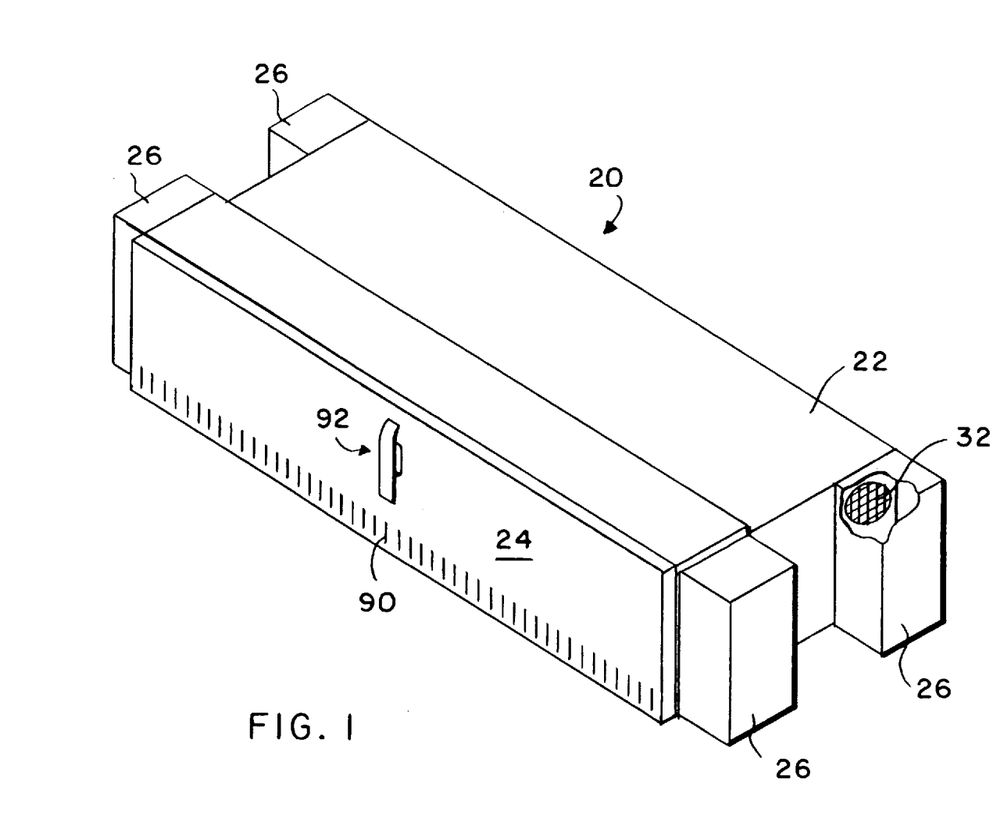
FIG. 1 shows a top front perspective view of the retrofittable battery cabinet of the present invention showing the front door with its latch and the detachable outriggers on the sides.

As shown in FIG. 1, the retrofit battery cabinet 20 is generally rectangular in shape. The housing 22 forms the predominant portion of the cabinet 20 with a removable door 24 generally sealing and protecting the contents therein. Outriggers 26 serve as extensions of the housing 22 to provide a more finished appearance to the retrofit battery cabinet and the entire telecommunications cabinet, and to provide cover and protection for the mounting brackets 60 and the fans 32. The outriggers 26 are fastened to the cabinet 20 and can only be removed from the inside when door 24 is removed. Additional features present in the retrofit battery cabinet of the present invention include sliding battery trays, a central control console, and a cooling/ventilation system. More about these is set forth below.

The retrofit battery cabinet 20 of the present invention is meant for use in conjunction with telecommunications cabinets often known in the industry as Type 80C or Type 80D cabinets. These generally tall and rectangular cabinets often sit upon concrete pads in yards specifically allocated for the provision and maintenance of telecommunications equipment. Generally, such yards are centrally located to provide a central area from which a certain and generally limited geographical area can be serviced by telecommunications services, namely telephone. In recent years, the use of optic fiber has increasingly replaced copper wire as the preferred carrier for signals. The telecommunications equipment housed in these telecommunications cabinets serve as centralized units whereby switching and/or signal transfer and direction can occur without heavy dependence upon the signal carrying medium.

Generally, such cabinets are supplied with energy from the local power grid. However, under certain emergency circumstances, the local power grid may fail. This requires the telecommunications cabinet to seek its energy from a different source in order to continue proper operation. As has arisen in the art, heavy duty batteries based on lead/acid or nickel/cadmium have become the standard for emergency power supplies for such telecommunications equipment. These batteries are very heavy, often weighing approximately 100 pounds apiece. In providing battery power to the telecommunications equipment, it is generally most advantageous to keep the batteries in a thermally temperate environment and one that is well-ventilated. As the telecommunications cabinets generally only provide accommodations for small batteries (which use valuable space otherwise available for electronics), the retrofit battery cabinet 20 of the present invention becomes an advantageous addition to the telecommunications cabinet by providing a large store of readily-available DC power safely sequestered beneath the telecommunications cabinet.

Figure 2:
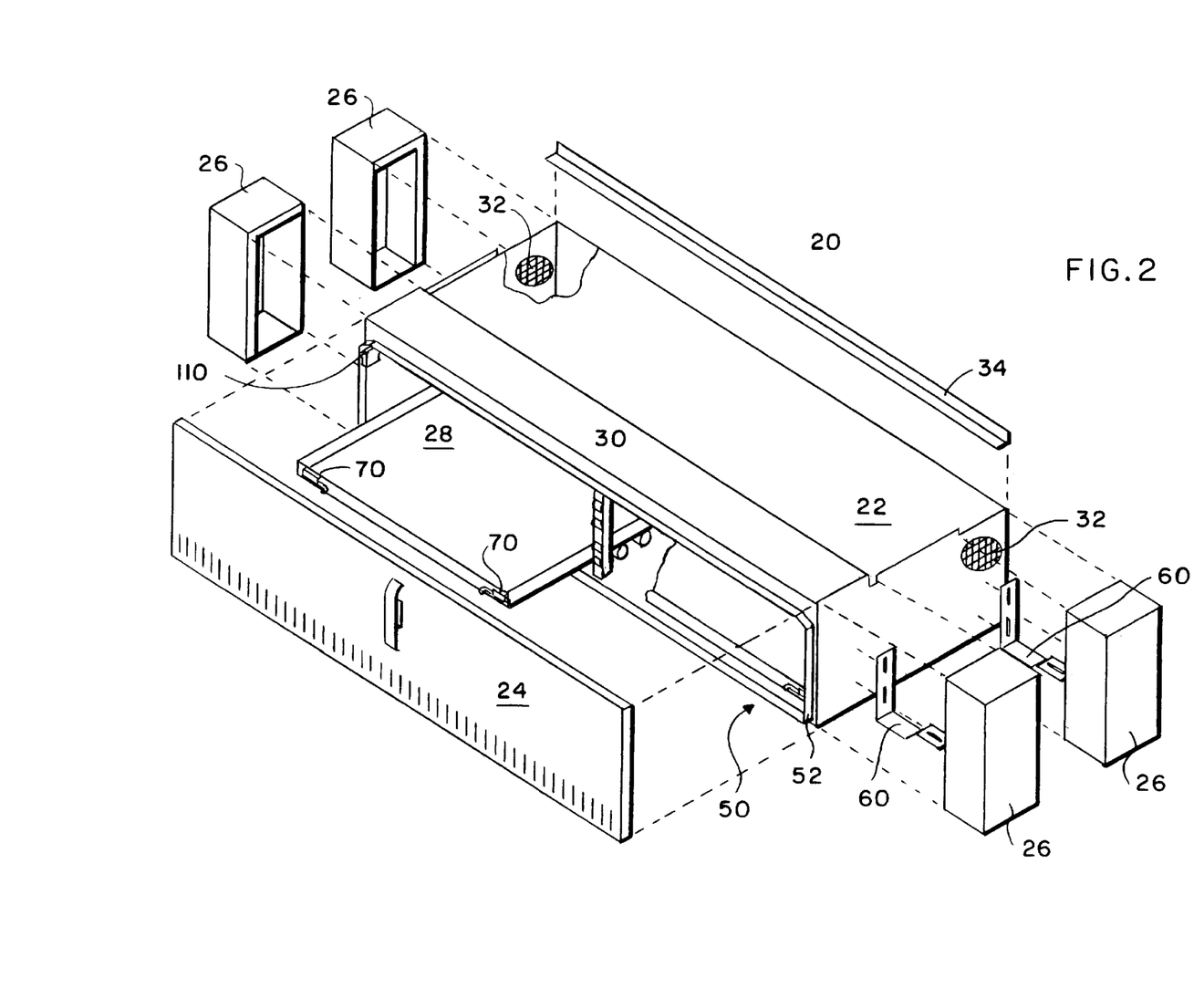
FIG. 2 shows an exploded view of the retrofittable battery cabinet of FIG. 1 with the removable door, outriggers, mounting brackets, and rear trim shown in alignment by dashed lines and also showing one of the slidable battery trays.

As shown in FIG. 2, the retrofit battery cabinet of FIG. 1 is shown in exploded view. As can be seen in more detail, the housing 22 provides a covering protection for the battery trays 28, the central console 30, and ventilating fans 32. A rear trim portion 34 is seen in FIG. 2, providing a shim or other device allowing a better and/or secure fit between the retrofit battery cabinet 20 and the telecommunications cabinet.

As mentioned above, the housing of the retrofit battery cabinet 20 fits within the telecommunications cabinet in order to provide cover and protecting storage for the emergency power supply batteries. The retrofit battery cabinet 20 is freestanding and enjoys a flush fit with respect to the adjoining portions of the telecommunications cabinet. When lifted, leveled, and/or nested under an 80C or 80D Type telecommunications cabinet, the retrofit battery cabinet 20 of the present invention appears to be part of the original cabinet structure. No modification of the original cabinet is necessary as the retrofit battery cabinet 20 of the present invention accommodates the currently existing structure of the telecommunications cabinet.

More direct attachment of the housing 22 or other portion of the retrofit battery cabinet 20 to the telecommunications cabinet is not required or demanded. Particularly, the telecommunications cabinet does not become a support for the retrofit battery cabinet 20. However, mechanical stability may be derived from the telecommunications cabinet by the retrofit battery cabinet 20. When the cabinet 20 is lifted, leveled, and nested under the type 80 cabinet, the top of the cabinet 20 nests within a channel present beneath the typical type 80 cabinet. Such nesting provides lateral stability even during rough shaking or seismic activity. The mounting brackets 60 are then secured to both the sunken pad bolts and the housing 22 via the slots present in the mounting bracket 60. Between the snug nesting of the cabinet 20 below the telecommunications equipment cabinet and the securement provided by the mounting brackets 60, the cabinet 20 is locked securely into place. The nesting of the battery cabinet 20 with the telecommunications cabinet may provide a gap for a bottom vent present in the telecommunications cabinet.

The outriggers 26 and the adjacent portion of the housing 22 circumscribe on three to sides each of the telecommunications cabinet support columns (not shown) present inside the telecommunications cabinet. Relative lateral movement is thereby prevented between the retrofit battery cabinet 20 and the telecommunications cabinet support columns and the telecommunications cabinet itself.

While there is no mechanical, load-bearing attachment between the retrofit battery cabinet 20 of the present invention and the telecommunications cabinet, there is the required electrical connection between the batteries enclosed in the housing 22 and the telecommunications circuitry. A robust power supply is provided by the present invention. This electrical connection can withstand some stress, shock, and/or duress, while maintaining a continuous and constant supply of power to the telecommunications equipment. Transformers or rectifiers associated with the telecommunications circuitry may step down or otherwise alter this voltage.

The retrofit battery cabinet 20 does not bear upon or load down the telecommunications equipment cabinet. The retrofit battery 20 is self-supporting and may be leveled and nested flush below the telecommunications equipment cabinet by the use of leveling feet accessible only from the confines of the interior of the housing 22. The flush fit between the two cabinets may provide a gap for a vent beneath the telecommunications cabinet. The concrete pad upon which the telecommunications cabinet rests provides the ultimate support for the retrofit battery cabinet 20 as well.

The retrofit battery cabinet 20, including the housing 22 and the outriggers 26, is generally constructed of one-eighth-inch (⅛") aluminum. Construction with ⅛" aluminum provides durable construction in addition to strength, lightweight, and better heat transfer characteristics. These qualities make such construction more advantageous for the purposes of the present invention as well as making the battery cabinet 20 easier to install and replace. All seams of the cabinet 20 are welded and ground smooth with all exposed surfaces being powder coated and sealed. As set forth in more detail below, some components used in the present invention are preferably made of steel and not aluminum. Such steel components are zinc plated after construction to provide for greater protection.

One of the advantages of the cabinet 20 of the present invention is that most features are accessible only from inside the housing 22. Limiting access to such features generally prevents tampering and/or vandalism. Additionally, it preserves the adjustments made to the retrofit battery cabinet 20 from accidental mis-adjustment or the like. Particularly advantageous to the present invention is the internal-only access to the leveler feet providing the adjustment means by which the retrofit battery cabinet 20 of the present invention may be leveled and set securely upon its ultimate support. These leveler feet must be sufficiently strong to endure the heavy, over 800 pounds, load applied to them by the retrofit battery cabinet 20 and its heavy battery contents.

Also secured within the confines of the housing 22 is the central support/central control console 30 as shown in FIG. 2. The battery trays 28 and batteries 40 (FIG. 3) sit side by side. The battery trays 28 and are slidably supported by rollers 42.

The housing 22 also contains two fans 32 at opposite top ends of the rear of the housing 22. The fans serve to draw air through the housing 22 to cool and ventilate the compartment defined therein. The fans are protected by the outriggers 26. Rear trim 34 or other trim may be present to ensure the best available fit between the retrofit battery cabinet 20 of the present invention and the telecommunications cabinet.

The housing 22 may also provide for one or more conduit passageways via punch-outs or the like. Specifically, provisions for three-quarter-inch (¾") conduits may be made on opposite sides of the housing 22 adjacent the outriggers 26.

Figure 3:
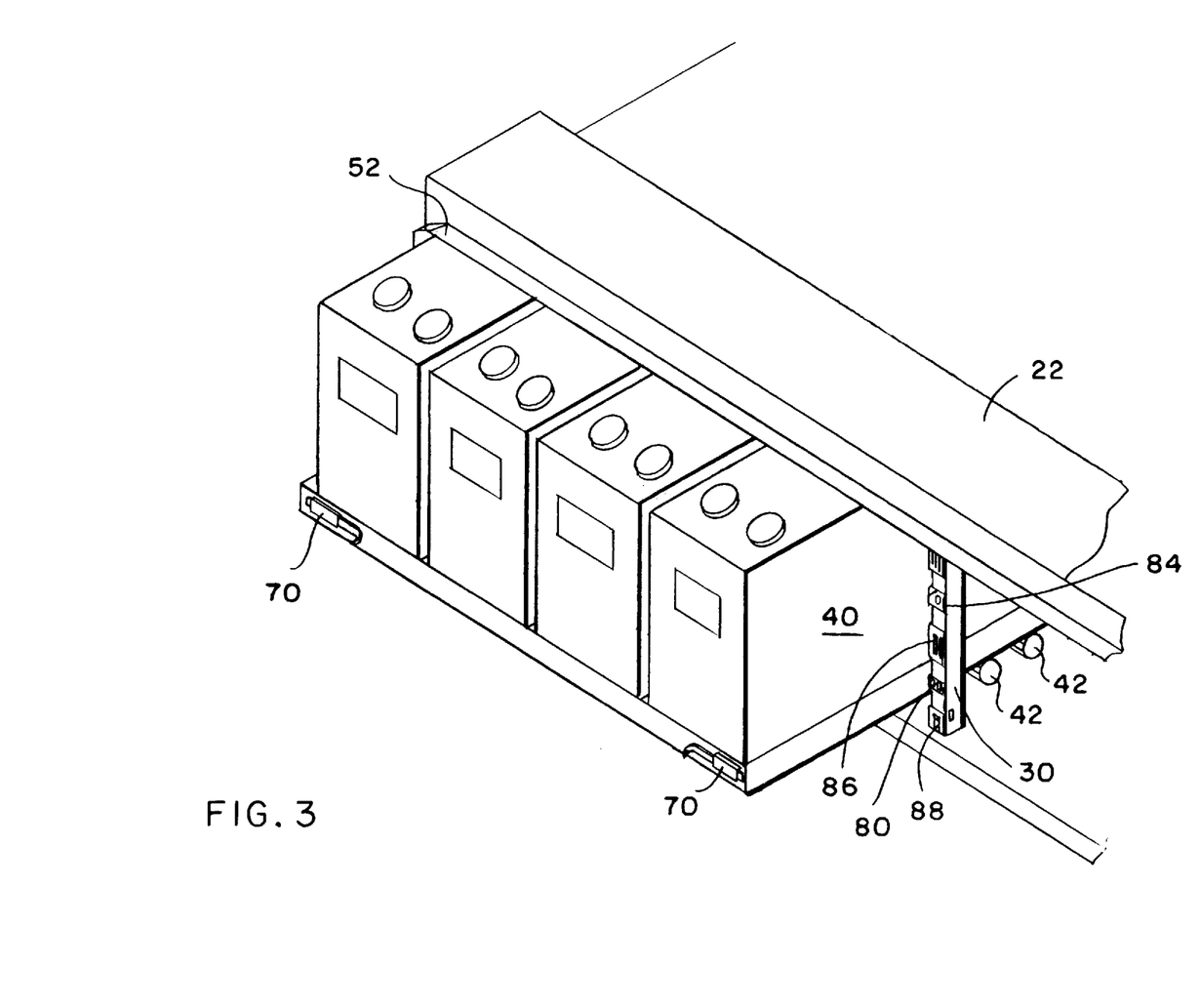
FIG. 3 shows a top front perspective view of one of the slidable battery platforms as it supports a series of four telecommunications equipment batteries.

As shown in FIGS. 2 and 3, the housing 22 may have an open front end 50 over which the removable door 24 may fit and through which the battery trays 28 may slide. The open front and/or aperture 50 may be gasketted about its perimeter by gasket material 52. The gasket material serves to provide a seal when the removable door 24 is set and latched in place on the housing 22. By providing a seal, the gasket 52 secures the interior compartment of the housing 22 from the elements by leakage and/or migration.

Figure 5:
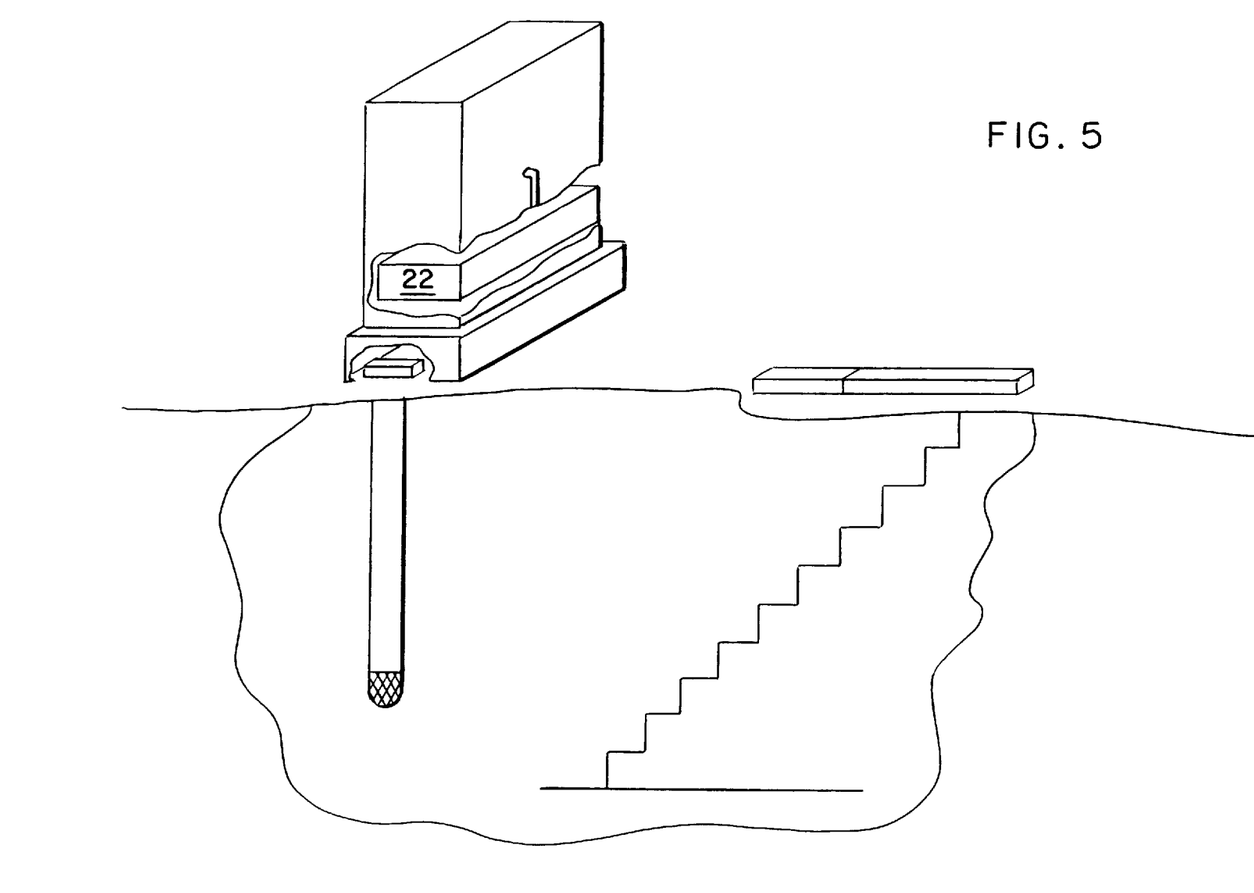
FIG. 5 shows a partial cutaway view of the thermal reservoir system as disclosed herein.

Optimally, a fluid gas connection as by a duct or otherwise may be established between the housing 22 and a subterranean or other active or passive thermal reservoir. As set forth in more detail below, such a thermal reservoir provides means by which a more consistent and preferably optimum thermal environment can be provided for the batteries 40 as their operation is dependent upon temperature and avoiding the extremes thereof.

The battery trays 28 slide in and out of the housing 22 independently and allow for independent operation of the individual battery trays 28. The battery trays serve to hold the batteries in place for greater mechanical and seismic stability.

The retrofit battery cabinet of the present invention not only protects the batteries from the elements such as dust and weather, but also protects the surrounding telecommunications cabinet from the batteries should a catastrophic event occur. As the batteries 40 may generate hydrogen gas, an inadvertent spark may cause an explosion which would be contained, at least to a certain extent, by the ⅛" aluminum construction of the housing 22 and remaining structures (such as the outriggers 26) of the retrofit battery cabinet 20 of the present invention.

The outriggers 26 sit in oppositely opposed disposition at each of the four side corners of the housing 22. The outriggers 26 are basically open shells connected to the housing 22 by means of carriage bolts and a cover bracket, or flange (FIG. 2). The outriggers 26 are mounted on either side of a telecommunications cabinet support column (not shown), match the type 80 cabinet's exterior to provide a finished appearance, and further lock the retrofit battery cabinet in place once the appropriate leveling and nesting have taken place inside the telecommunications cabinet. The outriggers are present, two on each side of the housing 22. In conjunction with the side of the housing 22 adjacent the telecommunications support column, three-sided circumscription of the support column by the outriggers and the housing is achieved on either side of the retrofit battery cabinet 20. Such three-sided circumscription is also achieved in conjunction with the brackets 60. This stabilizes the retrofit battery cabinet 20 laterally in all four directions as lateral travel toward the sides of the housing 22 is prevented by the actual sides of the housing 22. Forward and backward movement of the retrofit battery cabinet is prevented by the brackets 60, the outriggers 26, and the nesting of the cabinet 20 beneath the telecommunications equipment cabinet.

As can be seen, once the retrofit battery cabinet 20 has been lifted and nested into place, and when the internally-accessible fasteners for the outriggers 26 and brackets 60 have fastened and secured the outriggers 26, brackets 60, and housing 22 in place, the retrofit battery cabinet is laterally stabilized. As set forth above, the telecommunications equipment cabinet, including the support columns, do not serve to bear the load presented by the retrofit battery cabinet 20 even with its full complement of batteries 40. As such, with the retrofit battery cabinet 20 getting its ultimate support from the concrete or other pad beneath the telecommunications equipment cabinet, the retrofit battery cabinet 20 is well stabilized and well fitted within the telecommunications equipment cabinet.

As shown in FIG. 2, the external surface presented by the outriggers 26 is free from exposed bolts or nuts so that no external access is made available to the connection the outriggers 26 make with the housing 22. Instead, the outriggers 26 include flanges or extensions that serve to secure the outriggers 26 to the housing. By use of fasteners such as nuts and bolts or the like, the outriggers 26 can be fixed to the housing 22. Additionally, mounting brackets 60 are used to secure the cabinet 20 in place generally adjacent the telecommunications cabinet support column. The mounting brackets 60 may also serve to secure the retrofit battery cabinet 20 in general to the concrete pad or other support below the retrofit battery cabinet 20. The brackets 60 are covered by the outriggers 26.

By having the attachment fasteners of the outriggers 26 accessible only from within the housing 22, tampering or the like with respect to such attachment of the outriggers 26 to the housing 22 is avoided. Additionally, once the outriggers 26 have been properly adjusted and the fasteners tightened to secure the connections between the outriggers 26 and the housing 22, the internal access ensures that such adjustments are preserved.

The outriggers 26 also provide protective shrouds for the ventilating fans 32 while allowing air flow from within the housing 22 battery compartment external to the retrofit battery cabinet 20. The side of the outrigger 26 most adjacent to the telecommunications cabinet support column may be open and without a side panel. While generally this open face is held or kept closed by the snugly adjacent telecommunications cabinet support column, seams present provide egress and flow of the air ventilated by the fans 32 into the more general confines of the telecommunications cabinet 32. Alternatively, air may flow through an open side of the outriggers 26. While grates may be present over the fans preventing mechanical interference with the spinning fan blades, the shroud-like nature of the outriggers 26 over the fans provide additional protection.

As mentioned above, mounting brackets 60 are used to hold cabinet 20 securely in place and are covered by outriggers 26 adjacent to the support column to the housing 22. Generally, 3/16" L-shaped brackets 60 are used to provide such securement of the cabinet 20 to the concrete pad. These L-shaped brackets are able to withstand the load exerted upon them should they serve as means of attachment to an ultimate or other support below the retrofit battery cabinet 20. The L-shaped brackets can be connected to a concrete pad with ½" grade 5 bolts which are likewise able to withstand the load and/or stresses that may be applied to them when the retrofit battery cabinet 20 has its full complement of batteries 40.

The battery trays 28 may be made of steel in order to assure secure engagement and stable, reliable support of the batteries 40. Such steel construction is further enhanced with zinc plating to prevent corrosion. Two battery trays 28 are provided on either side of the central control console 30 and are independently operable, sliding in and out upon rollers 42 that are able to withstand the stresses, load, and shear applied by a full complement of batteries 40. Each tray 28 can support at least 500 pounds and provides easy means by which the batteries 40 can be provided to the adjoining and associated telecommunications cabinet.

Rollers 42 are present on either side of the trays 28 at the bottom of the tray and may be held in races or the like to ensure controlled extension of the associated battery tray 28.

The trays 28 fully extend to allow easy installation, access, repair, and replacement of the batteries 40. The cantilevered nature of the battery trays 28 allow full extension of them through the open front end 50 of the housing 22. The loads and stresses applied by the batteries when in their fully extended position are well within the tolerances for the mounting bracket 60 and any bolts used in conjunction with them when nested under the type 80 cabinet.

The split tray assembly allows independent operation, adjustment, installation, and repair of each set of four batteries. To this end, one set of batteries can be taken off-line for replacement, repair, adjustment, or the like while the other batteries situated in the other battery tray which would continue to supply or continue to be ready to supply emergency power to the telecommunications equipment in the associated telecommunications cabinet. Once one set of batteries in the first tray is made ready for use in conjunction with the associated telecommunications equipment, the appropriate connections and preparations can be made, the batteries may be slid back into place, and the other set of batteries 40 in the other battery tray may be adjusted, repaired, or replaced with complete continuity of power despite the fact that repairs or alterations need to be made to the batteries or DC power supply of the adjoining telecommunications equipment cabinet. Thus, the telecommunications equipment held in the telecommunications equipment cabinet never need to be without power.

As an additional safety feature present in the retrofit battery cabinet 20 of the present invention, spring-loaded latches may be used in pairs at the front end of each of the battery trays 28. These spring-loaded latches 70 fit into notches or the like to secure the battery trays in place, making sure that they cannot slide out of the housing 22 unless and until both latches 70 are released. Not only does this provide for more secure retention of the battery trays 28, it also prevents the removable door 24 from acting as a stop or guard. As the latches 70 enjoy a snug fit with respect to the notches into which their spring-biased bolts fit, very little momentum of the very heavily laden battery trays can be generated before tray motion is stopped, as in an earthquake. As is known in Southern California, earthquakes on the order of Richter scale 6.0 to 8.0 may occur. Such violent tremors and shaking of the earth have a tendency to disrupt any loose objects such as plates and crockery on shelves to dislodging houses from their foundations. In comparison with the massive force and energy available through earthquake tremors, the 800 pounds or more of battery weight held by the retrofit battery cabinet 20 of the present invention is a mere straw. By reducing the available motion of the battery tray 28 and its batteries 40, greater safety and retention of the batteries 40 are provided, ensuring more reliable operation under emergency circumstances and preventing the risk of injury against those who might be close by during an always-unexpected earthquake.

Despite the fact that the spring-loaded latches 70 are present at opposite front ends of the battery tray 28, they are easily released by a service person or technician by merely pulling the latches out of the notches against the bias provided by the spring. As an additional safety feature, the removable door 24 cannot be set into place and latched into place upon the housing 22 without the spring-loaded latches 70 of the battery trays 28 being properly in place, locking the trays 28 into secure position.

Centrally located between the two battery trays 28 is the central console 30 which provides easy access and reach to several advantageous operating features and elements of the battery cabinet 20. The central console 30 provides support for such features and connections. It also separates the battery trays 28 without taking up needed and/or available space within the tight confines of the space provided for the retrofit battery cabinet 20 within the telecommunications cabinet. A vertical configuration of the console 30 provides easier access and support for the controls and connections thereon. Such connections include a separate battery connection to allow independent connection of each of the series of batteries 40 in each tray 28 so that one battery tray 28 may be taken off-line while leaving the other one online, as set forth above. The battery connections 80 are known in the art and are standard in the industry.

Additionally, a thermostat 82 can be provided to allow thermal monitoring of the confines of the housing 22 and battery compartment. The thermostat may control the ventilating fans 32 and any heater pads used to keep the batteries warm (if present).

Additionally, a hydrogen gas detector may be used to detect hydrogen gas within the confines of the battery compartment. Upon detecting hydrogen gas at a certain threshold concentration, the hydrogen gas detector may serve to energize the fans so that they may ventilate the interior of the housing 22. Alternatively, a timer may be used that periodically serves to activate the fans 32, thereby drawing fresh air into the housing 22 and across the batteries 40 in order to flush out any hydrogen gas.

Fuses 84 may also be present to serve to protect the fans 32. Breaker switches 86 may also be used to take the batteries off-line if for some reason too much power is drawn from them (as by a short circuit). An intrusion alarm reset or cancel button 88 may be present for use in conjunction with the intrusion alarm as set forth in more detail below. The intrusion alarm reset/cancel button terminates the alarm response generated either immediately or a short time after the removable front door 24 is unlatched and removed from the front of the housing 22.

Figure 4:
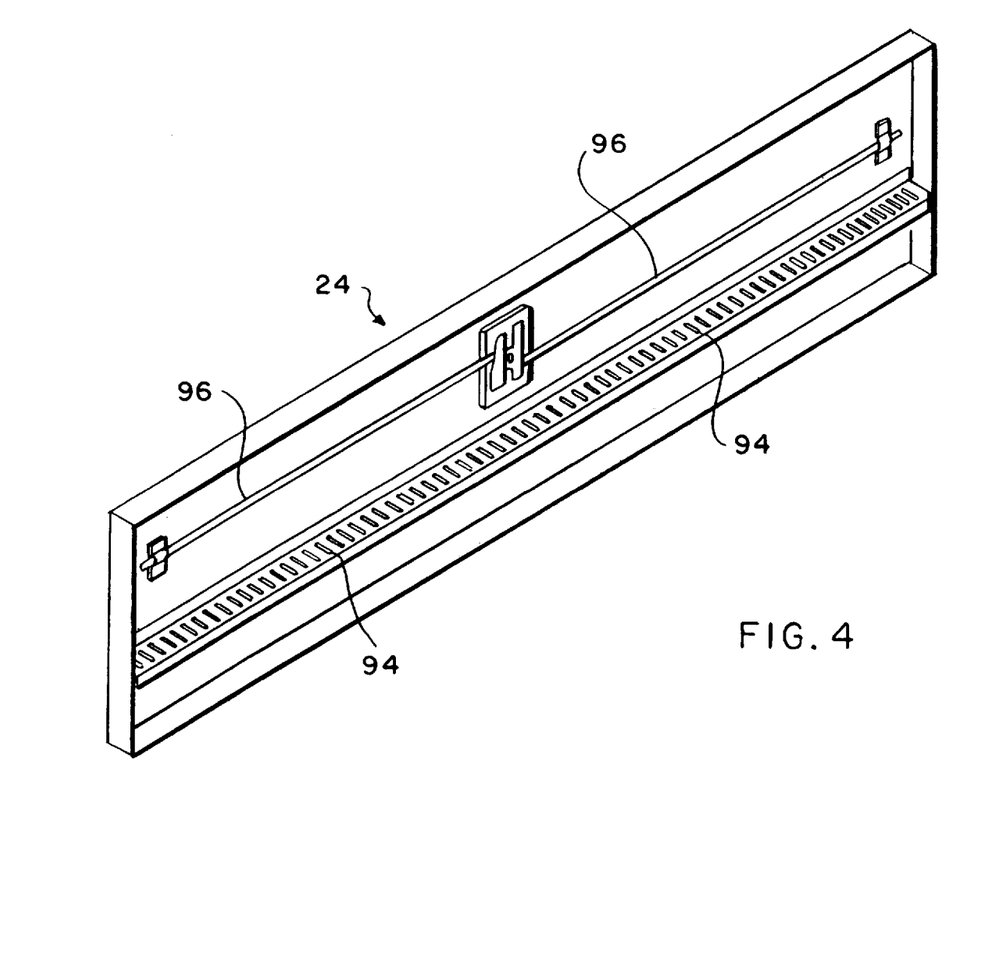
FIG. 4 shows a top rear perspective view of the removable door as shown in FIG. 1 with its latching mechanism and vent.

The removable door 24 is, like the housing 22, made of ⅛" aluminum construction so that it is lightweight, strong, as well as being easy to install, remove, and replace. The door 24 matches the open front end 50 of the housing 22 and has a full-length vent 90 running along its lower internal, or interior, portion. A full-length vent allows air to flow over the entire length of the batteries 40 within the confines of the housing 22. This provides for better ventilation of the housing 22 interior and ensures that sufficient cooling and/or ventilation occurs within the battery compartment. Not only can this provide sufficient cooling for the batteries, it can also ensure adequate and complete ventilation of any hydrogen gas that may accumulate.

In a preferred embodiment, the vent 90 may be present adjacent a lower flange of the door 24. By forming a slight recess for air flow, and by using a Z-shaped bracket, a vent can be formed using small slots or slits. Similar to the vent 90 shown in FIG. 1, the vent present below the door is less visible and less subject to mischief and vandalism. As the perimeter gasket 52 is only at the top and sides of the door opening, the physical barrier is present on those three sides prevents objects from being introduced into the battery cabinet 20. The punched, Z-shaped bracket 94 prevents the introduction of articles from the bottom of the door 24. As a gap exists between the door 24 and the housing 22, air can flow evenly across the batteries by convection or by fan. Alternatively, the vent 90 can be as shown in FIG. 1.

Set at the front of the removable door 24 is a latch 92 having a handle. As shown in FIG. 4, turning of the handle serves to retract locking arms 96 whose ends preferably snugly fit into locking notches present in the housing 22. A three-point stainless steel latch secures the door 24 to the housing 22, preferably snugly against the gasket 52 to seal the open front end 50 of the housing 22 save for the full-length vent 90. The latch 92 may have a handle 98 allowing easy latching and unlatching of the door 24. The handle 98 may also make provision for a padlock so that the removable door 24 may be lockably secured to the housing 22.

The removable door 24 is entirely removable from the housing 22 to provide complete and free access to the trays 28 and batteries 40. By providing for an entirely removable door 24, the retrofit battery cabinet 20 of the present invention allows the battery trays 28 to completely roll out and extend from the confines of the housing 22. This provides excellent access to the batteries 40 held by the battery trays and provides easier installation, repair, replacement, and adjustment of the batteries 40. In order to ensure the secure placement of the battery trays 28, the removable door 24 cannot be set into place unless the spring-loaded latches 70 present on the battery trays 28 are latched properly into place.

The door 24 has been set forth as being entirely removable, however, it can be seen that so long as the door 24 is disposed so as not to interfere with the articulation and displacement of the battery trays 28 throughout their course of motion, the door 24 could also be hingeably or otherwise attached to the housing 22.

In conjunction with the removable door 24, an intrusion alarm or switch 110 may be used in conjunction with the removable door 24 so as to provide a signal whenever the door 24 is open and access to the batteries 40 in the confines of the housing 22 occurs. The intrusion alarm or switch 110 may be a microswitch that generates a signal whenever the door 24 is removed from the open front end 50 of the housing 22. A cut-off, cancel, or reset switch 88 may be present on the central console 30 allowing the knowledgeable service person or technician to turn off the alarm. The alarm may signal a central switchboard, computer, or security person that access has been obtain to the confines of the battery cabinet 20. If it is determined that mischief or vandalism is possible, appropriate actions can then be taken upon receiving the signal generated by the intrusion alarm 110. Additionally and/or alternatively, the intrusion alarm reset switch 88 may require a code so that mere pressing of a labeled button is inadequate to terminate the intrusion alert signal generated by the alarm 110. In order to provide sufficient time for such a code or reset signal to be entered, a timer may be used in conjunction with the reset switch 88.

As is known in the art, batteries may be damaged by extreme heat yet are only temporarily impaired by severe cold. Ambient everyday temperatures throughout the United States during the warmer months of the year generally provide adequate thermal operating conditions for batteries such as those used in conjunction with the present invention. However, extreme heat, as is found in the southern United States and in the equatorial regions of the world, may require some measure of cooling to occur inside the confines of the housing. As the batteries may generate heat, either when being recharged (by a trickle charge or otherwise) or during discharge, warmer ambient temperatures may serve to compound the thermal stress experienced by the batteries 40.

In order to relieve the build-up of warmer thermal conditions within the confines of the housing 22, ventilating fans 32 may serve to draw air through the full-length vent 90 present along the bottom length of the removable door 24. These fans 32 may be powered by the batteries 40 and may have associated with them flaps constituting a valve allowing for only one-way flow of air in the direction of the fan-driven air flow. As the fans are battery powered, they preferably impose minimal energy demands upon the batteries 40.

The fans 32 serve to vent warm air while pulling cooler ambient air into the confines of the housing 22. Additionally, the batteries 40 may generate or discharge hydrogen gas which, when it accumulates, may provide a risk of explosion. By ventilating the hydrogen gas, this risk of dangerous hydrogen explosion is diminished or eliminated. Fuses 84 present in the central console 30 may serve to protect the fans 32 from a short circuit or the like. An alarm along the lines of that used as the intrusion alert 110 may serve to notify a central monitoring station of a blown fan fuse. In a preferred embodiment, the fans may each draw 1,000 cubic feet per minute through the confines of the housing 22 to provide 2,000 cubic feet per minute of air flowing through the battery compartment.

In colder climes, battery operation may be impaired due to the reduction of the chemical processes providing electrical energy. Such chemical processes generally experience reaction rates that are directly dependent upon temperature. In order to ensure more optimal battery operation, battery or other powered heating pads or the like (not shown) may be included in conjunction with the retrofit battery cabinet 20 of the present invention. These heating pads may rest below the batteries 40 or below the battery trays 28 in order to allow the heat generated by the heating pads to rise up into the interior of the housing 22. The thermostat 82 may control the operation of the heating pads as well as the fans and may allow some control over the heating operation of the heating pads.

In a sophisticated alternative embodiment, a subterranean or other thermal reservoir may be used to control the thermal conditions within the battery compartment of housing 22. As is known in the art, caves and the like generally experience constant temperatures throughout the changing seasons of the year. By providing a subterranean cavern or reservoir of ambient air below the frost line or otherwise protected from the changing conditions above ground, a source of constant-temperature air may be provided for one or more retrofit battery cabinets in a telecommunications system. By connecting a duct or the like from the retrofit battery cabinet 20 to the subterranean reservoir, a source of constant-temperature air is provided to the battery cabinet 20. In so doing the duct (not shown) might replace the full-length vent 90 of the removable door 24. Alternatively, the vent 90 may be maintained, but some valve or switch system used to control the use of ambient air to flush hydrogen gas from within the confines of the housing, and constant-temperature air in order to provide the appropriate thermal environment for the batteries 40.

The subterranean or other thermal reservoir needs to provide sufficient air volume at the preferred or available temperature (such temperature sufficient for battery 40 operation in the retrofit battery cabinet 20). In order to enhance the operation of the reservoir, heat exchangers or radiators may be used to control the effective temperature of the air flowing into the housing 22 from the reservoir. Such radiators would preferably have a large surface area of excellent thermal conducting material. The reservoir may be akin to a basement of a house in that walk-in access to the reservoir may be available from above ground and closed off from the weather above ground by a sealed or weather-stripped door or the like.

In setting forth the retrofit battery cabinet 20 of the present invention it is understood that moisture, elements, weather, and adverse ambient conditions are generally kept out and away from the batteries 40 and the electrical components contained in the retrofit battery cabinet 20. This protection is doubly secured by the fact that, in general, telecommunications cabinets provide protection against the weather for the enclosed telecommunications equipment.

In a preferred embodiment, the following materials may be used to construct the following components of the present invention. The cabinet, enclosure, and door may be made of 0.125" 5052H-32 aluminum. The battery tray and brackets may be made of 10, 12, or 14 gauge HR steel which is zinc plated after fabrication. The lifting and leveling devices may be made of 13 gauge stainless steel. The central leveling adjustment device may be 3/8" zinc plated grade 5 steel bolt driving a one inch (1") square tube foot. The spring-loaded latches may be heavy duty reverse slides plated with zinc. The ½" grade 5 bolts may also be zinc plated.

The two battery trays each have two fabricated slides with each slide having six bearings. The bearings may have a bearing roller that is 1" in diameter. A 1" diameter sealed roller which is 5/8" wide with a 1" stud with 7/16–20 thread may be used. The bearings can each minimally take 1,400 pounds in dynamic load so that their capacity is not is exceeded by the weight of the batteries 40. The three point latch assembly 92 may be provided with a polished stainless steel padlock handle. Trim seal gasket material is used as required around the perimeter of the open front end 50 of the housing 22.

Exhaust fans are used having tube axial brushless operation with air flow capacities of 1,000 cubic feet per minute. A temperature control switch is powered by AC or DC supply and is adjusted at a set point of 70° F. to 140° F. via a biometallic thermal coupler. The alarm may be provided by a 15A plunger type microswitch. The battery circuit breakers may be 25 amp or as required 120 volt DC circuit breakers as supplied by Heinemann Electric Company or equal. Fuses used in the present invention may be 3 amp or as required 60 volt Type 70 fuse assemblies. Additionally, 70 amp, 250 volt DC Anderson or equal power pole connectors may be used. Terminal blocks may be used in the present invention as required.

A control timer switch may be used to activate the fans to provide automatic exhaust of the battery compartment. If required, standard AC or DC heating pads for each tray may be provided with the necessary insulation and heat shielding as necessary.

Although the present invention has been described with regards to particular embodiments, it is recognized that additional variations of the present invention may be devised without departing from the inventive concept.

What I claim is:

1. A retrofit battery cabinet for use in conjunction with telecommunications equipment protected from ambient environmental conditions in a telecommunications equipment cabinet, the retrofit battery cabinet comprising:

a housing, said housing fitting within a space provided by the telecommunications equipment cabinet so that the telecommunications equipment cabinet protects said housing from the ambient environmental conditions, said housing comprising construction of one-eighth inch (⅛") aluminum and defining an open front aperture or opening along its entire front width to provide open and clear access to batteries within said housing, said open front aperture having a perimeter circumscribed by a gasket, said housing defining notches capable of receiving a latch bolt;

a pair of battery trays, each of said battery trays slidably coupled to said housing so that each of said battery trays independently and selectably moves with respect to said housing so that batteries held by said battery trays may be more easily accessed and serviced, said battery trays each able to support of load of five hundred pounds (500 lbs.) or more, said battery trays each comprising:

a flat pan, said flat pan supporting said batteries;

retaining flanges, said retaining flanges circumscribing said flat pan and retaining said batteries upon said flat pan;

said flat pan and said retaining flanges comprising zinc-coated steel;

a pair of said spring-loaded latches, said spring-loaded latches oppositely opposed on a front end of said battery tray, each of said spring-loaded latches engaging one of said notches to automatically latch and secure said battery tray to said housing when said battery tray slides into said housing, said spring-loaded latches requiring that they be set into place with respect to said housing before a door may be placed upon said housing to enclose said batteries within the retrofit battery cabinet;

a raceway, said raceway coupled to said battery tray; and rollers, said rollers engaging said raceway and allowing travel of said raceway over said rollers, there being six (6) rollers for each of two opposite sides of said battery tray; whereby said tray may travel into and out of said housing as said raceway travels overs said rollers and said battery tray when loaded with a full complement of batteries holds and retains said batteries upon said battery tray;

a plurality of adjustable levelling feet strategically distributed across a bottom of said housing, said adjustable levelling feet distributing weight of the retrofit battery cabinet including any batteries across an ultimate support, each of said adjustable levelling feet comprising zinc-plated and/or stainless steel and able to withstand weight of the retrofit battery cabinet including any batteries, said adjustable levelling feet adjustably coupled to said housing to provide level adjustment means for adjusting a level of said housing, said adjustable levelling feet located internally to said housing and being available for adjustment only from inside said housing, each of said adjustable levelling feet comprising:

a threaded pin, said threaded pin threadably traveling through said housing; and a pressure-distributing foot, said pressure-distributing foot coupled to said threaded pin; whereby weight applied to said adjustable levelling foot by the retrofit battery cabinet is distributed by said pressure-distributing foot upon said ultimate support and said housing may be made level by suitable adjustment of each of said adjustable levelling feet and nested in place;

four (4) outriggers coupled to and extending laterally from opposite side corners of said housing so that a pair of outriggers is present on each side of said housing, each of said outriggers of said pairs spaced apart from its companion to define a gap for a telecommunications support column, said outrigger pairs providing stability for the retrofit battery cabinet and said housing as the retrofit battery cabinet is trapped between telecommunication support columns to restrict all horizontal motion of the retrofit battery cabinet, said outriggers providing a protective shroud for a fan while permitting air flow via said fan, each of said outriggers being open on three sides and closed on three sides to provide a covering shroud for an adjoining portion of said housing, adjustment and mounting of each of said outriggers to said housing accessible only from inside said housing, each of said outriggers comprising one-eighth inch (⅛") aluminum, each of said outriggers having a mounting bracket, said mounting bracket coupling an associated outrigger to said housing, whereby said associated outrigger is more stably secured to said housing, a mounting bolt coupled to said mounting bracket attaching the retrofit battery cabinet to said ultimate support, said mounting bolt and said mounting bracket capable of withstanding loads and stresses inflicted by the retrofit battery cabinet when fully loaded with batteries upon said mounting bolt and said mounting bracket;

first and second battery-powered fans powered by batteries held within the retrofit battery cabinet or an outside source, said fans coupled to opposite sides of said housing, said fans drawing air through an interior of said housing, whereby said interior may be flushed with fresh air and thereby ventilated, each of said fans providing air flow of at least one thousand cubic feet per minute (1000 cfm);

a removable door, said removable door covering a front aperture defined by said housing, said removable door comprising one-eighth inch (⅛") aluminum and defining a front vent, said front vent travelling along the entire front bottom of said door, said removable door bearing a three (3) point stainless steel latch securing said removable door to said housing, said latch having a handle providing for engagement by a lock whereby said door may be lockably secured to said housing, said door positively engaging said gasket circumscribing said front aperture of said housing to seal said perimeter of said front aperture, said removable door unable to securely engage said housing unless said battery trays are latched and secured to said housing;

an intruder alarm, said intruder alarm transmitting a signal upon removal or opening of said door; and a central console, said central console providing easy but exclusively internal access to connectors, elements, and sensors within said housing, said central console vertically positioned between said battery trays, said central console comprising:

a thermostat, said thermostat coupled to said central console and monitoring temperature internal to said housing;

a fan fuse, said fan fuse coupled to said central console and preventing an excess of power from flowing to a fan;

a battery breaker, said battery breaker coupled to said central console, said battery breaker tripping if an excess of power is associated with a battery connected to said battery breaker; and a battery connection, said battery connection coupled to said central console, said battery connection allowing a battery upon said battery tray to be easily connected to the battery retrofit cabinet to supply associated telecommunications equipment with battery power; whereby said thermostat, said fan fuse, said battery breaker, and said battery connection are made more easily accessible; whereby a retrofit battery cabinet is provided that securely maintains its adjusted level and prevents tampering of said adjusted level and internal components from outside said housing.

2. The retrofit battery cabinet of claim 1, wherein said central console further comprises a timer, said timer coupled to one or more of said fans, said timer periodically activating said one or more of said fans to ensure evacuation of accumulated hydrogen gas from within said housing.

3. The retrofit battery cabinet of claim 1, wherein said first and second fans further comprise:

valve means for controlling air flow, said valve means permitting one-way air flow out of said housing but impairing air flow into said housing; whereby air flow generated by said fans is allowed by said valve means but other air flow is otherwise impaired.

4. The retrofit battery cabinet of claim 1, wherein said fans are activated by said thermostat.

5. The retrofit battery cabinet of claim 1, wherein said central console further comprises an intruder alarm reset, said intruder alarm reset coupled to said central console and resetting an intruder alarm.

6. The retrofit battery cabinet of claim 1, wherein said central console further comprises a hydrogen gas detector, said hydrogen gas detector coupled to said central console and detecting presence of hydrogen gas above a certain threshold concentration.

7. The retrofit battery cabinet of claim 1 wherein at least one of said battery trays further comprises a heating pad, said heating pad coupled to said battery tray and providing warmth to batteries held by said battery tray.

8. The retrofit battery cabinet of claim 1, wherein said housing is coupled to a thermal reservoir, said thermal reservoir providing an interior of said housing with air at a constant temperature.

9. The retrofit battery cabinet of claim 8, wherein said thermal reservoir is subterranean.

10. A retrofit battery cabinet for use in conjunction with telecommunications equipment protected from ambient environmental conditions in a telecommunications equipment cabinet, the retrofit battery cabinet comprising:

a housing, said housing fitting within a space provided by the said telecommunications equipment cabinet so that the telecommunications equipment cabinet protects said housing from ambient environmental conditions;

housing stabilizing means for stabilizing said housing with respect to the telecommunications equipment cabinet;

an outrigger, said outrigger coupled to said housing, coupling of said outrigger to said housing accessible only from inside said housing, said outrigger constructed of one-eighth inch (⅛") aluminum;

a mounting bracket, said mounting bracket coupling said outrigger to said housing, whereby said outrigger is more stably secured to said housing;

a mounting bolt, said mounting bolt coupled to said mounting bracket to attach the retrofit battery cabinet to an ultimate support, said mounting bolt capable of withstanding loads and stresses inflicted by the retrofit battery cabinet when fully loaded with batteries upon said mounting bolt;

a battery receptacle, said battery receptacle defined by said housing and providing a protected area within which batteries may be held by said housing; and level adjustment means for adjusting a level of said housing, said level adjustment means coupled to said housing, said level adjustment means located internally to said housing and being available for adjustment only from inside said housing; whereby a retrofit battery cabinet is provided that securely maintains its adjusted level and prevents tampering of said adjusted level from outside said housing.

11. A retrofit battery cabinet for use in conjunction with telecommunications equipment protected from ambient environmental conditions in a telecommunications equipment cabinet, the retrofit battery cabinet comprising:

a housing, said housing fitting within a space provided by the said telecommunications equipment cabinet so that the telecommunications equipment cabinet protects said housing from ambient environmental conditions;

an outrigger, said outrigger coupled to said housing, coupling of said outrigger to said housing accessible only from inside said housing, said outrigger constructed of one-eighth inch (⅛") aluminum, said outrigger being open on three sides and being closed on three sides to provide a covering shroud for an adjoining portion of said housing, said outrigger providing a protective shroud for a fan while permitting air flow via said fan;

a mounting bracket, said mounting bracket coupling said outrigger to said housing, whereby said outrigger is more stably secured to said housing;

housing stabilizing means for stabilizing said housing with respect to the telecommunications equipment cabinet, including four (4) outriggers extending laterally from opposite side corners of said housing so that a pair of outriggers is present on each side of said housing, each of said outriggers of said pairs spaced apart from its companion to define a gap for a telecommunications support column, whereby stability for the retrofit battery cabinet is provided by said outriggers and said housing as the retrofit battery cabinet is trapped between said telecommunication support columns to restrict all horizontal motion of the retrofit battery cabinet;

a battery receptacle, said battery receptacle defined by said housing and providing a protected area within which batteries may be held by said housing; and level adjustment means for adjusting a level of said housing, said level adjustment means coupled to said housing, said level adjustment means located internally to said housing and being available for adjustment only from inside said housing; whereby a retrofit battery cabinet is provided that securely maintains its adjusted level and prevents tampering of said adjusted level from outside said housing.

12. A retrofit battery cabinet for use in conjunction with telecommunications equipment protected from the elements in a telecommunications equipment cabinet, the retrofit battery cabinet comprising:

a housing, said housing fitting within a space provided by the telecommunications equipment cabinet so that the telecommunications equipment cabinet protects said housing from the elements;

a battery receptacle, said battery receptacle defined by said housing and providing a protected area within which batteries may be held by said housing including a battery tray, said battery tray slidably coupled to said housing so that said battery tray selectably moves with respect to said housing so that batteries held by said battery tray may be more easily accessed and serviced;

said housing having a central console, said central console providing easy but exclusively internal access to connectors, elements, and sensors within said housing, said central console vertically positioned between said battery tray on one side and a second battery tray on another side, said central console having a thermostat, said thermostat coupled to said central console and monitoring temperature internal to said housing, said central console having a fan fuse, said fan fuse coupled to said central console and preventing an excess of power from flowing to a fan, said central console having a battery breaker, said battery breaker coupled to said central console, said battery breaker tripping if an excess of power is associated with a battery connected to said battery breaker, said central console having a battery connection, said battery connection coupled to said central console, said battery connection allowing a battery upon said battery tray to be easily connected to the battery retrofit cabinet to supply associated telecommunications equipment with battery power, whereby said thermostat, said fan fuse, said battery breaker, and said battery connection are made more easily accessible; and level adjustment means for adjusting a level of said housing, said level adjustment means coupled to said housing, said level adjustment means located internally to said housing and being available for adjustment only from inside said housing; whereby a retrofit battery cabinet is provided that securely maintains its adjusted level and prevents tampering of said adjusted level from outside said housing.

13. The retrofit battery cabinet of claim 12, wherein said central console further comprises:

an intruder alarm reset, said intruder alarm reset coupled to said central console and resetting an intruder alarm.

14. The retrofit battery cabinet of claim 12, wherein said central console further comprises:

a hydrogen gas detector, said hydrogen gas detector coupled to said central console and detecting presence of hydrogen gas above a certain threshold concentration.

15. The retrofit battery cabinet of claim 12, wherein said central console further comprises:

a timer, said timer coupled to said central console and a fan, said timer activating said fan on a periodic basis to ventilate an interior of said housing.

* * * * *